(12) United States Patent
Johnston

(10) Patent No.: US 6,549,427 B1
(45) Date of Patent: Apr. 15, 2003

(54) CIRCUIT TRACE TERMINATION AND METHOD

(75) Inventor: James J. Johnston, St. Petersburg, FL (US)

(73) Assignee: Methode Development Company, Chicago, IL (US)

(*) Notice: Subject to any disclaimer, the term of this patent is extended or adjusted under 35 U.S.C. 154(b) by 36 days.

(21) Appl. No.: 09/669,325

(22) Filed: Sep. 25, 2000

Related U.S. Application Data

(63) Continuation-in-part of application No. 09/333,817, filed on Jun. 15, 1999, now Pat. No. 6,123,588.

(51) Int. Cl.$^7$ ................................................ H01R 9/00
(52) U.S. Cl. ........................ 361/823; 361/822; 361/827; 434/874
(58) Field of Search .................. 361/822, 823, 361/827; 439/492, 499, 860, 874; 174/88 R; 29/876–879

(56) References Cited

U.S. PATENT DOCUMENTS

| | | | |
|---|---|---|---|
| 5,475,921 A | * 12/1995 | Johnston | 29/878 |
| 6,167,616 B1 | * 1/2001 | Shinchi | 174/92 |
| 6,195,885 B1 | * 3/2001 | Ito et al. | 29/857 |
| 6,247,977 B1 | * 6/2001 | Tanaka et al. | 439/492 |
| 6,302,981 B1 | * 10/2001 | Sakaguchi et al. | 156/290 |

* cited by examiner

*Primary Examiner*—Albert W. Paladini
*Assistant Examiner*—Tuan Dinh
(74) *Attorney, Agent, or Firm*—McCormick, Paulding & Huber LLP

(57) ABSTRACT

Metallic circuit traces disposed on a substrate of a panel and terminated in a high-density in-line array. Each termination comprises a terminal portion of a circuit trace disposed on and extending along a beam defined by the panel, a portion of a resilient compressible electrical conductor disposed in overlying relation to at least an associated part of the terminal portion, and a cradle assembly including a cradle member and a cap ultrasonically welded together in assembly generally within a common plane of joinder spaced from the substrate. The cradle assembly surround portions of the beam, the terminal portion, and the conductor and maintains the conductor under compression and in electrical contacting engagement with the terminal portion to form an electrical termination.

20 Claims, 8 Drawing Sheets

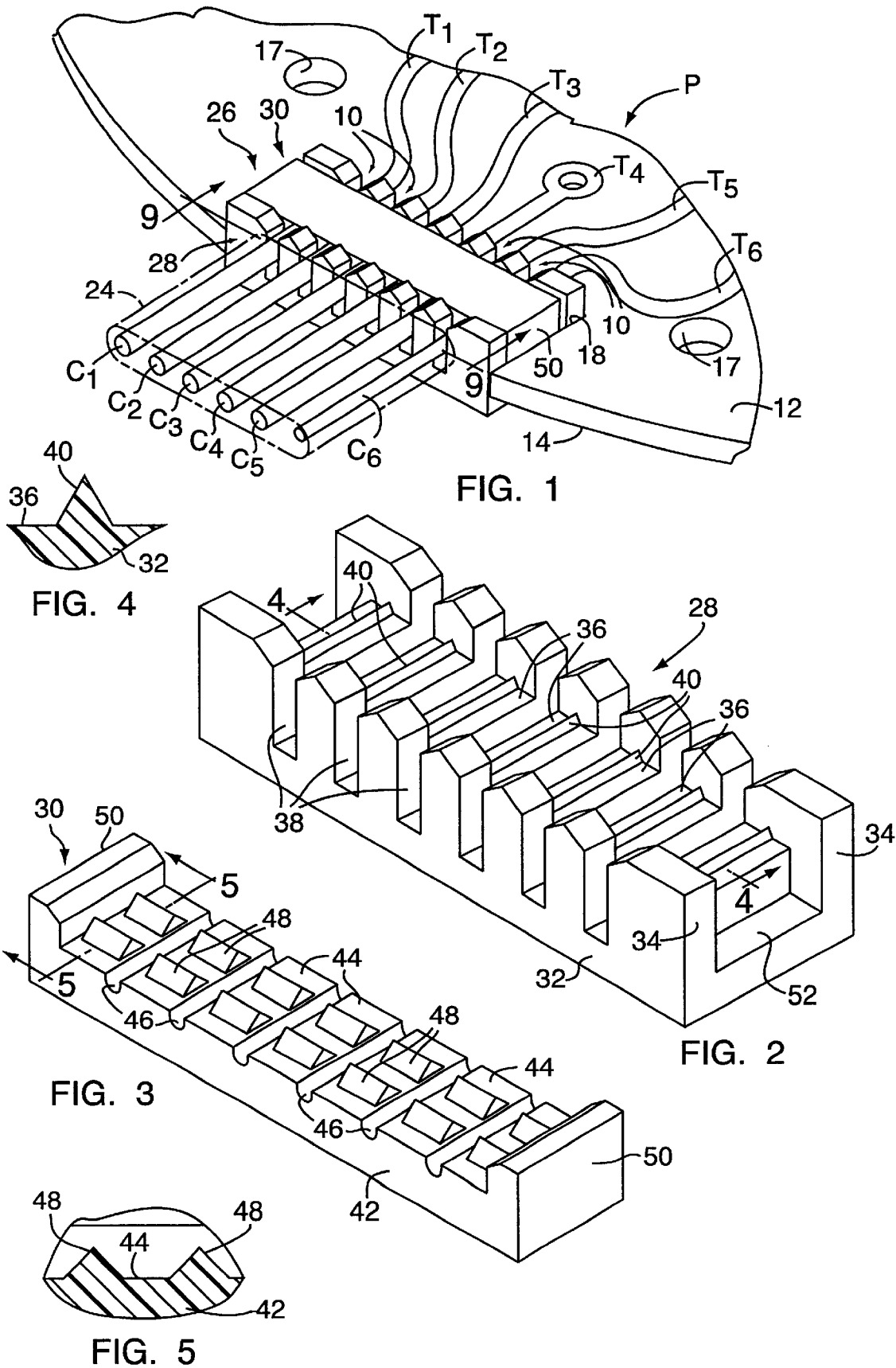

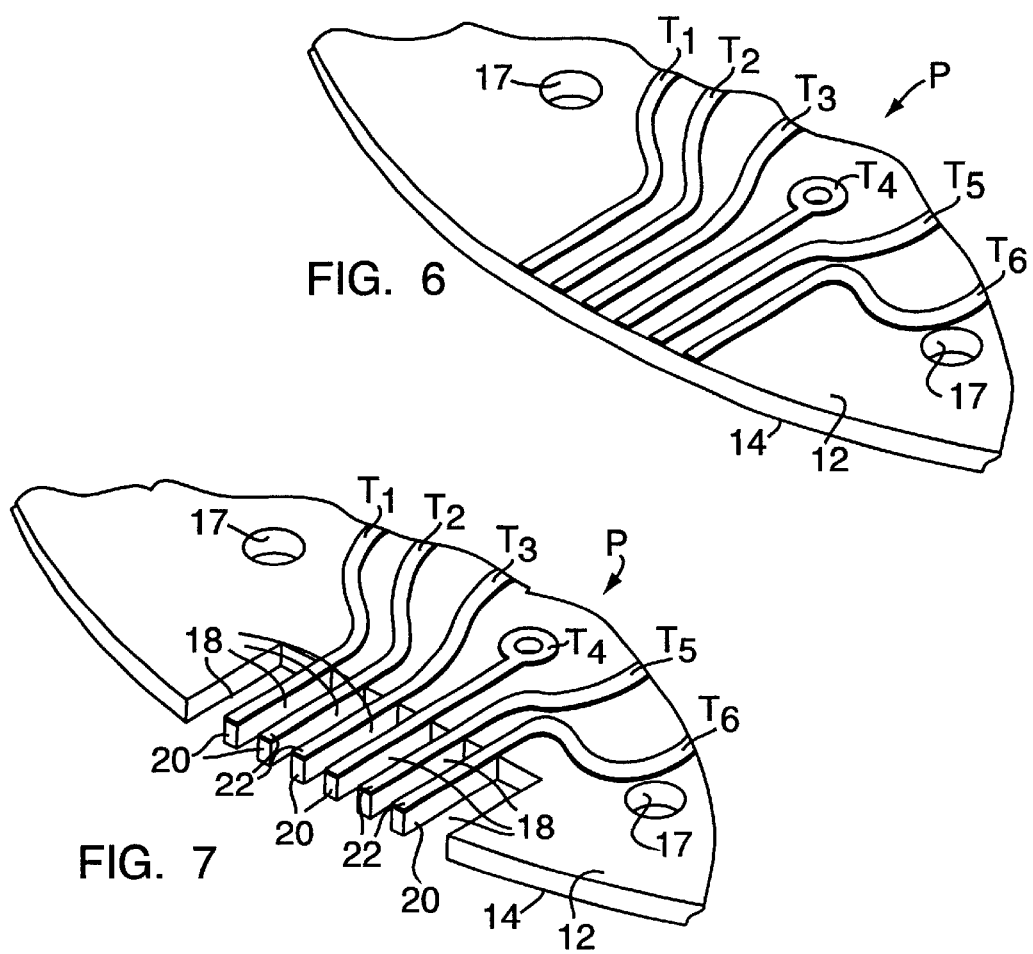
FIG. 6
FIG. 7
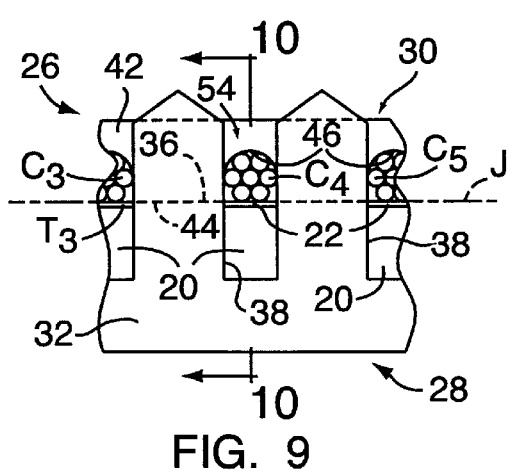
FIG. 9
FIG. 10

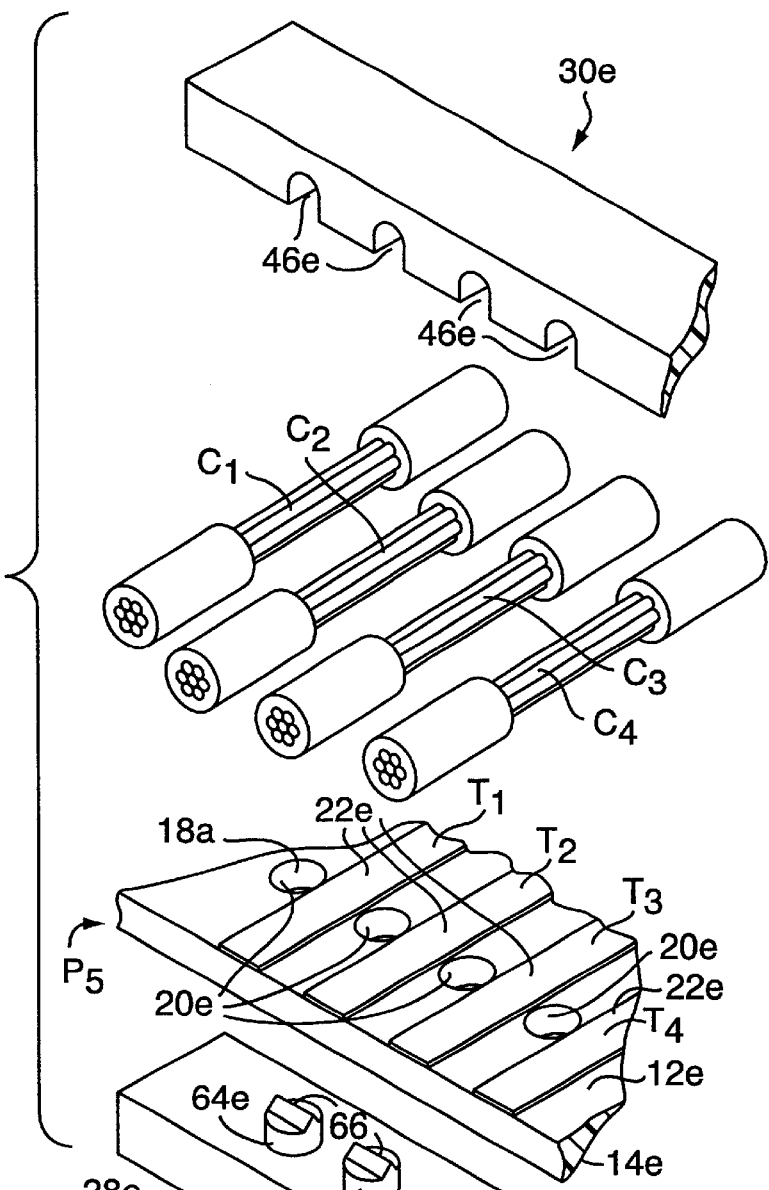
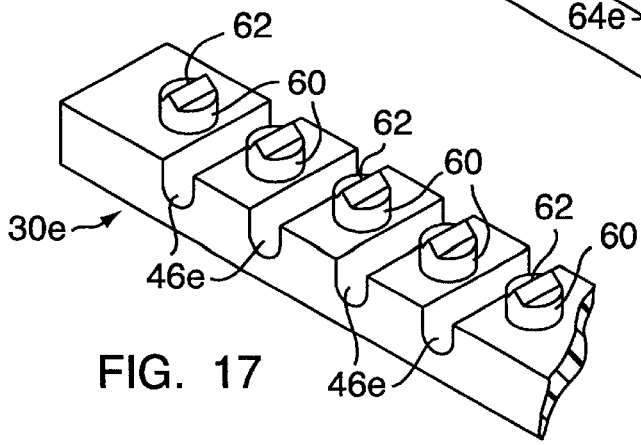

CIRCUIT TRACE TERMINATION AND METHOD

CROSS REFERENCE TO RELATED APPLICATION

This is a continuation-in-part of application Ser. No. 09/333,817, filed Jun. 15, 1999 having U.S. Pat. No. 6,123,588.

FIELD OF INVENTION

This invention relates in general to electrical terminations and terminating methods and deals more particularly with improved terminations for electrical circuit traces on panels and printed circuit boards and methods for making such terminations.

BACKGROUND OF THE INVENTION

This invention relates in general to electrical connections and terminations and deals more particularly with improved terminations for circuit traces disposed on surfaces of panels, circuit boards and the like and particularly termination of metallic circuit traces of the etched copper variety.

Such circuit traces are suitable for termination by several standard termination techniques, including edge connection for printed circuit boards employing a stiffener or paddle board approach, soldering or welding including laser techniques, contact piercing type print terminations and pressure or spring termination designs. However, each of the aforesaid generally accepted techniques has limitations. Termination techniques which employ solder, for example, may be wholly unacceptable for many medical applications. Conventional mechanical termination techniques often prove troublesome where the device having the terminations is or may be exposed to frequent shock and/or vibration, as, for example, in automotive applications. Further, many of the standard termination techniques impose limitations upon the spacing which must be provided between adjacent terminations making these techniques generally unsuitable for use where high-density in-line termination is required.

The present invention is concerned with the afore described general problems.

Accordingly, it is the general aim of the present invention to provide an improved metallic circuit trace termination highly resistive to shock and vibration and which enables maximization of termination density.

SUMMARY OF THE INVENTION

In accordance with the present invention, a printed circuit termination comprises a panel at least a portion of which is substantially rigid, defines a beam, and has generally parallel upper and lower surfaces, at least one of the surfaces defining a substrate. A circuit trace carried by the substrate has a terminal portion which extends along a portion of the substrate defined by the beam. A resilient compressible electrical conductor is disposed in overlying electrical contacting engagement with the terminal portion. The termination further includes an ultrasonically weldable cradle assembly formed by a cradle member and an energy director cap member. The energy director cap member cooperates in assembly with the cradle member to define a termination barrel receiving and confining therein at least parts of the beam, the terminal portion, and the resilient compressible electrical conductor. The cradle and cap members are ultrasonically welded together along a plane of joinder and maintain under compression that portion of the resilient compressible electrical conductor which is disposed within the termination barrel and which overlies the terminal portion of the circuit trace, whereby the electrical conductor is continuously resilient biased into electrical contacting engagement with the terminal portion of the circuit trace. In accordance with a method of the invention, a compressibility factor is determined for the resilient compressible conductor and is employed in dimensioning the termination barrel so that the resilient conductor is maintained in a compressed condition within the termination barrel. The energy stored in the compressed resilient conductor maintains the integrity of the termination.

BRIEF DESCRIPTION OF THE DRAWINGS

FIG. 1 is a fragmentary perspective view showing an in-line array of printed circuit terminations embodying the present invention and made in accordance with the invention.

FIG. 2 is a somewhat enlarged perspective view of the energy director cap member shown in FIG. 1.

FIG. 3 is a perspective view of the cradle member of FIG. 1 shown rotated 180° in a counterclockwise direction about its longitudinal axis and from its position of FIG. 1.

FIG. 4 is a somewhat enlarged fragmentary sectional view taken along the line 4, 4 of FIG. 2.

FIG. 5 is a somewhat enlarged fragmentary sectional view taken along the lien 5—5 of FIG. 3.

FIG. 6 is a somewhat reduced fragmentary perspective view of a panel with circuit traces thereon.

FIG. 7 is similar to FIG. 6 but shows the panel after it has been cut to form beams thereon.

FIG. 9 is a fragmentary sectional view taken along the line 9—9 of FIG. 8.

FIG. 10 is a somewhat schematic view showing a test apparatus used to determine the compressibility factor of a conductor.

FIG. 16 is a fragmentary exploded perspective view of another in-line array of printed circuit terminations embodying the invention and made in accordance with the invention.

FIG. 17 is a fragmentary perspective view of the cradle member of FIG. 16 shown in an inverted position.

DETAILED DESCRIPTION OF PREFERRED EMBODIMENTS AND METHODS

Figure 11:
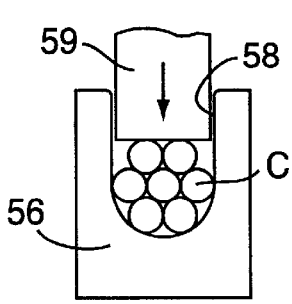
FIG. 11 is similar to FIG. 7 but shows another panel after it has been cut to form termination beams.

The present invention is concerned with methods for terminating one or more electrically conductive circuit traces carried by a panel or printed circuit board and the termination or terminations produced by these methods. In the drawings and in the description which follows the invention is illustrated and described with particular reference to a typical circuit panel indicated generally by the letter P in FIG. 1 and carrying a plurality of metallic electrical circuit traces $T_1$–$T_6$. An in-line array of terminations indicated at 10, 10, embodying the present invention and made in accordance with the invention, comprise electrical connections which terminate each of the traces $T_1$–$T_6$ to an associated one of a plurality of discrete electrical conductors indicated at $C_{1-C6}$ which comprise part of an electrical cable, all of which will be hereinafter more fully described.

The panel P or at least that portion of the panel which includes terminal ends of the traces $T_1$–$T_6$ to be terminated is made from a relatively hard rigid material, that is a material which has a yield or fracture strength greater than that of the other materials utilized in making the terminations so that it will not undergo significant elastic deformation or otherwise be significantly compressed by the application of a pressure within a range of pressures to be encountered in forming the terminations, as will be hereinafter further discussed. Fiberglass compositions have proven particularly suitable for making the panel. However, materials such as pheonolic compounds, ceramics, metal core structures and other materials commonly used in the production of the printed circuit boards may also prove suitable for use as a panel material.

The panel P has upper and lower surfaces respectively indicated at 12 and 14. Tooling holes 17, 17 are preferably provided and extend through the panel P to receive dowel pins (not shown) for locating and holding the panel P in fixed position during the terminating process hereinafter described. The discrete circuit traces $T_1$–$T_6$ on the upper surface or panel substrate 12 are preferably formed from copper and may be plated and etched on the substrate in accordance with a conventional process for making a printed circuit board.

Referring to FIG. 6 it will be noted that end portions of the traces $T_1$–$T_6$ are disposed in closely spaced parallel relation to each other and extend outwardly to and end at a peripheral edge of the panel P. Referring now to FIG. 7, the panel P with the metallic circuit traces $T_1$–$T_6$ thereon is further prepared for termination by cutting or otherwise forming a plurality of apertures or parallel slots 18, 18 in the panel extending inwardly from the peripheral edge of the panel between the parallel end portions of the traces $T_1$–$T_6$ and adjacent the end-most traces in the series, the traces $T_1$ and $T_6$, thereby forming a plurality of cantilever beams 20, 20 on the panel which extend outwardly from the panel, as best shown in FIG. 7. The width of the slots or spaces 18, 18 formed between adjacent beams 20, 20 may vary. However, where a high-density array of terminations is to be formed the beams are preferably of substantially uniform width, the width of each beam being somewhat greater than the width of each slot 18 between adjacent beams.

After the slots 18, 18 have been formed, it will be noted that an end portion of each circuit trace extends along the portion of the surface or substrate 12 defined by an associated beam 20. The portion of each trace carried by each associated beam is hereinafter designated as a terminal portion of the trace and indicated by the numeral 22 in FIG. 7.

Resilient compressible electrical conductors, connectors and contacts of various types may be employed to terminate the circuit traces carried by the panel P and offer a wide variety of arrangements for coupling circuits on the panel P with other electronic equipment. However, the traces $T_1$–$T_6$ on the illustrated panel or printed circuit board P are terminated by a shielded electrical cable 24 containing a plurality of flexible individually insulated resilient compressible stranded wire electrical conductors $C_1$–$C_5$. In FIG. 1 the cable 24 is shown in phantom, the conductors which comprise the cable being shown in full lines for clarity of illustration. A sixth conductor $C_6$, which is employed to terminate trace $T_6$, is an uninsulated resilient compressible solid wire conductor and serves as a drain wire for the shielded cable 24.

The individually insulated stranded wire.conductors $C_1$–$C_5$ are prepared for termination by removing insulation from each of the conductors in spaced relation to its free end. Insulation is preferably thermally stripped from the stranded wire conductors in the aforesaid manner employing a well known thermal stripping process. It should be noted that after the stripping operation has been performed a layer of insulation surrounds the free end portion of each of the stranded wire conductors $C_1$–$C_5$.

Termination of the traces $T_1$–$T_6$ is simultaneously effected by an ultrasonic welding process utilized to assemble an ultrasonically weldable cradle assembly indicated generally at 26 in FIG. 1 and which includes an energy director cap member, designated generally by the numeral 28 in FIG. 2, and a cradle member, shown in FIG. 3 and indicated generally at 30. The energy director cap member 28, best shown in FIG. 2, has a base 32 and a pair of transversely spaced apart sidewalls 34, 34 which extend upwardly from the base 32. A longitudinal series of upwardly facing planar surfaces 36, 36 defined by the base 32 extend transversely between the sidewalls 34, 34 and lie within a common plane. A plurality of generally rectangular and upwardly open beam receiving slots indicated at 38, 38 open upwardly through the base 32 between the surfaces 36, 36 and upwardly and outwardly through the sidewalls 34, 34, as shown in FIG. 2. A plurality of secondary energy directors 40, 40 are integrally formed on the cap member 28. Each energy director 40 is disposed generally centrally of an associated surface 36, projects upwardly from the surface, and extends transversely between the sidewalls 34, 34 substantially as shown. The secondary energy directors 40, 40 are substantially alike, each having a generally triangular cross-section terminating at an apex which forms an included angle of approximately 60° as shown in FIG. 4.

Referring now to FIG. 3, the cradle member 30 is shown rotated 180° about its longitudinal axis from its position of assembly in FIG. 1. The cradle member 30 has a base 42 which defines a longitudinal series of downwardly facing surfaces 44, 44 which extend transversely of the cradle member 30 and lie within a common plane. A longitudinal series of transversely extending and downwardly open conductor receiving cradles 46, 46 are formed in the base 42. Each conductor receiving cradle 46 is disposed between an associated pair of downwardly facing surfaces 44, 44 and has a generally arcuate cross-section. Each surface 44 caries a pair of primary energy directors 48, 48. The primary energy directors 48, 48 extend longitudinally of the cradle member 30. Each energy director 48 has a generally triangular cross-section characterized by an apex forming an included angle of 90°, as shown in FIG. 5.

The cradle member 30 is constructed and arranged for mating engagement in assembly with the cap member 28 and has a width dimension substantially equal to the spacing between the inner surfaces of the sidewalls 34, 34 on the cap member. The cradle member 30 has opposite end walls 50, 50 which depend from the base 42 when the cradle member is in its assembled condition and which are adapted to be received within and substantially complement recesses 52, 52 formed in opposite ends of the energy director cap member 28. When the cradle member 30 is disposed in its preassembled position in mating engagement with the energy director cap 28 each pair of transversely spaced primary energy directors 48, 48 is disposed in crossing relation relative to an associated one of the secondary energy directors 40 on the energy director cap member. In the preassembled condition each cradle 46 is disposed in registry with an associated one of the beam receiving slots 38.

Considering now the manner in which the cradle assembly 26 is assembled with the panel P to effect the various terminations 10,10. The energy director cap 28 is preferably first positioned relative to the panel P with each beam 20 disposed within an associated beam receiving slot 38, the beams being fully seated within the slots 38, 38 and complementing associated portions of the slots. A bare or stripped portion of each of the conductors $C_1$–$C_5$ is disposed in overlying electrical contacting engagement with the terminal portion 22 of an associated one of the traces $T_{1-T5}$. The bare wire conductor $T_6$, which comprises a drain wire is disposed in the energy director cap in overlying electrical contacting engagement with the trace T6. The stripped or exposed bare wire portions of the insulated conductors $C_{1-C5}$ are of sufficient length to be wholly received within the cradles 46, 46 when the cradle member 30 is in its preassembly position on the energy director cap 28.

The afore described preassembled structure which includes the printed circuit panel P, the cradle assembly 26, and the conductors $C_{1-C6}$, which may be secured in preassembled condition by an associated jig (not shown), is positioned on the horn of an ultrasonic welding machine of a conventional type. Pressure is first applied to the cradle assembly 26 by the machine to urge the cradle member 30 and the energy director cap member 28 toward assembly with each other. When a predetermined assembly pressure has been attained ultrasonic energy is applied to the cradle assembly by the ultrasonic welding machine to effect melt down of the primary and secondary energy directors by the simultaneous and combined application of ultrasonic energy and pressure. When the surfaces 36, 36 attain engagement with the surfaces 44, 44, welded joinder of the energy director cap member and the cradle member will occur in a plane of joinder defined by the coengaging surfaces 36, 36 and 44, 44. At this point the application of ultrasonic energy to the assembly ceases, but the pressure acting upon the assembly is maintained. Pressure is maintained for a predetermined cooling period during which the welds solidify. Thereafter, machine pressure is released allowing the circuit panel with finished circuit trace terminations to be removed from the ultrasonic welding machine.

Each termination comprises a termination barrel formed by the cooperation of a beam receiving slot 38 with an associated conductor receiving cradle 46. A typical termination is shown in FIGS. 9 and 10, wherein the termination barrel formed by the cradle 46 and the beam receiving slot 38 is indicated generally at 54, encompasses at least a part of a beam 20, a terminal portion of a trace indicated at 22, and an associated resilient compressible electrical conductor, the conductor $C_4$ being shown. The energy director cap and cradle members are ultrasonically welded together along a plane of joinder generally defined by the coengaging surfaces 36,36 and 44,44 and indicated by the letter J in FIG. 9 and maintain under compression that portion of the resilient compressible electrical conductor $C_4$ which is disposed within the termination barrel 54 and which overlies the termination portion 22 of the circuit trace $T_4$.

The mechanical aspects of the termination and the method for making it having been explained, the dimensional relationships essential to assurance of a proper termination will now be considered.

The dimensioning requirements for the termination barrel 54 are predetermined by the physical characteristics and dimensioning of a resilient compressible electrical conductor C to be received within the termination barrel. Thus, for example, where the electrical conductor C employed in making the termination is an axially elongated stranded copper wire conductor, such as a seven strand conductor which undergoes significant physical and cross-sectional dimensional change when subjected to radially directed compressive force within the range contemplated by the method of the present invention, this factor must be considered in determining the required depth dimensions of the termination, barrel 54 produced by the afore described assembly process. The width dimension of the termination barrel will be substantially equal to the width dimension of the compressible conductor C and, as in the present example, where the conductor is generally cylindrical the width dimension of the termination barrel will be substantially equal to the diameter of the bare conductor, that is the portion of the conductor with the insulation removed therefrom. The change in cross-sectional dimension of the conductor produced by application of a force of known magnitude acting in a radial direction upon a portion of the conductor, and hereinafter referred to as the compressibility factor, is determined for the particular conductor or conductors to be employed in terminating the terminal portions of the circuit traces. The compressibility factor is employed in determining the optimum depth dimension of the termination barrel.

Referring now to FIG. 11 the compressibility factor for a typical conductor C, may, for example, be determined by providing a test material 56, preferably the same material from which the cradle assembly is made, and forming a test slot 58 therein having a transverse dimension substantially equal to the transverse dimension of the termination barrel 54 (see FIG. 9) and a bottom or inner end wall which complements an associated portion of the conductor C to be tested when the conductor C is disposed within the test slot 58. A ram 59 is provided for sliding movement within the test slot and in a radial direction relative to the conductor C disposed in the test slot. A compressing force equal in magnitude to the force to be applied to the cradle assembly 26 by the ultrasonic welder during the welding process is applied to the test conductor C by the ram 59.

Where the conductor C is a stranded wire conductor, as hereinbefore discussed, some of the initial force applied to the conductor will be absorbed in rearranging or compacting of the conductor strands. However, when the strands attain a substantially stable condition further applied force will generally be utilized to compress the material from which the test conductor C is formed. The force applied to the conductor must not, of course, exceed the elastic limit of the material from which the conductor is made. However, a force in excess of the elastic limit of the conductor is not likely to be encountered in the proper practice of the method of the present invention.

The width dimension of the beams to be formed on the panel P will be determined by the width dimension of the barrel termination slot, the latter dimension being substantially equal to the width dimension or diameter of the uninsulated portion of the conductor. Thus, where cylindrical conductors are to be employed in practicing the invention the width dimension of each beam will be equal to the diameter of a conductor to be employed in terminating an associated circuit trace. The height dimension of the beam will be substantially equal to the thickness of the panel portion from which the beam is formed. The height dimension or thickness of the terminal portion of a trace measured in a vertical direction is also a known quantity.

The compressibility factor, which may be expressed as a percentage change in the dimension of the conductor in the direction of applied force is also a known quantity, having been determined by testing. Thus, the height dimension or depth of the termination barrel 54 may be calculated by determining the sum of the vertical dimensions of the beam 20, the terminal portion of a trace T, and the diameter of the conductor C less the allowance for compressibility which will occur as a result of the force applied by the ultrasonic welding machine during assembly. Thus, energy is stored within the compressed conductor which is resiliently biased toward electrically contacting engagement with the terminal portion of an associated trace.

Figure 8:
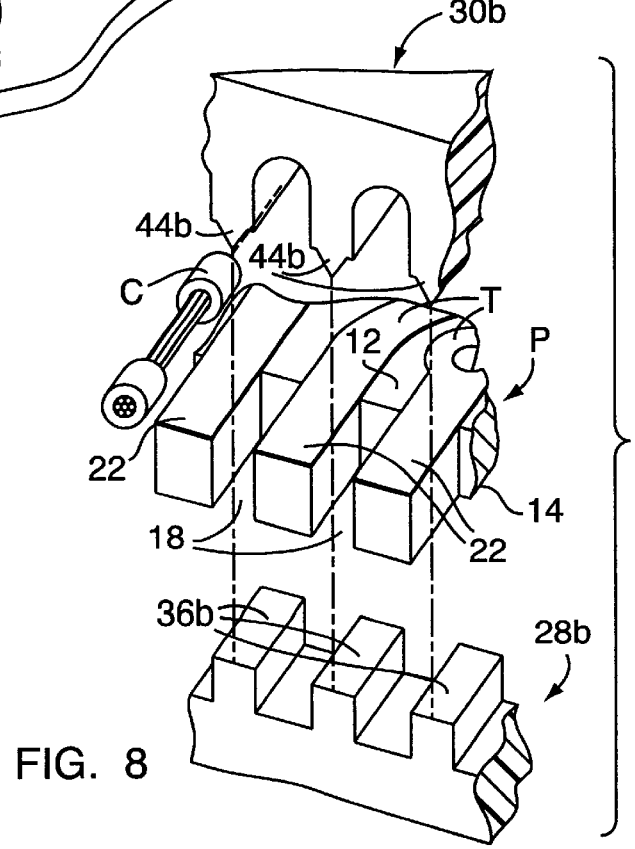
FIG. 8 is a somewhat enlarged fragmentary exploded perspective view of the structure shown in FIG. 1.

Further, and with respect to FIG. 8, by predetermined dimensioning of the termination, the dimensions of an energy director cap and cradle members 28b, 30b may be controlled so that the plane of joinder formed by co-planar surfaces 44b,44b and 36b,36b of the cradle member and cap member is disposed in generally parallel relation to the upper and lower surfaces 12 and 14 of the panel P and lies substantially midway between the upper surface 12 and lower surface 14 of the panel P. This condition is particularly desirable where the panel P is relatively thick.

Where an in-line series of terminations is desired, but the density of the terminations in the series is not an important consideration, as in the embodiment of the invention illustrated in FIG. 1, the spacers between the termination barrels 54, 54 may have a width greater than the width of the termination barrels. Thus, the spacers shown in FIG. 1 and disposed between the beams 20, 20 are wider than the beams 22,22 and provide confinement of the beams to enable attainment of a high degree of structural integrity.

Figure 12:
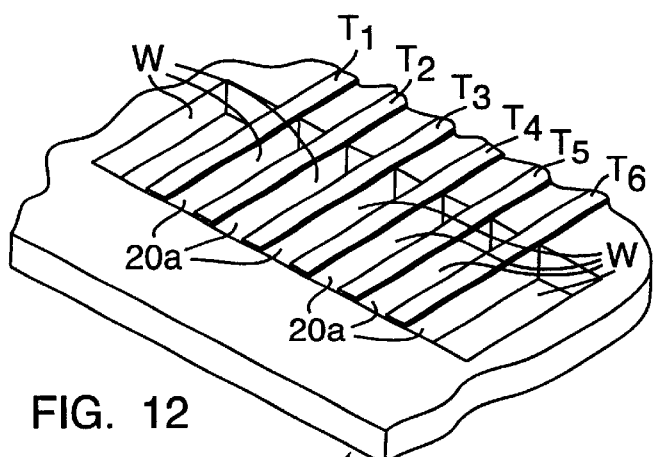
FIG. 12 is a fragmentary perspective view showing a termination formed on the panel of FIG. 11.
Figure 13:
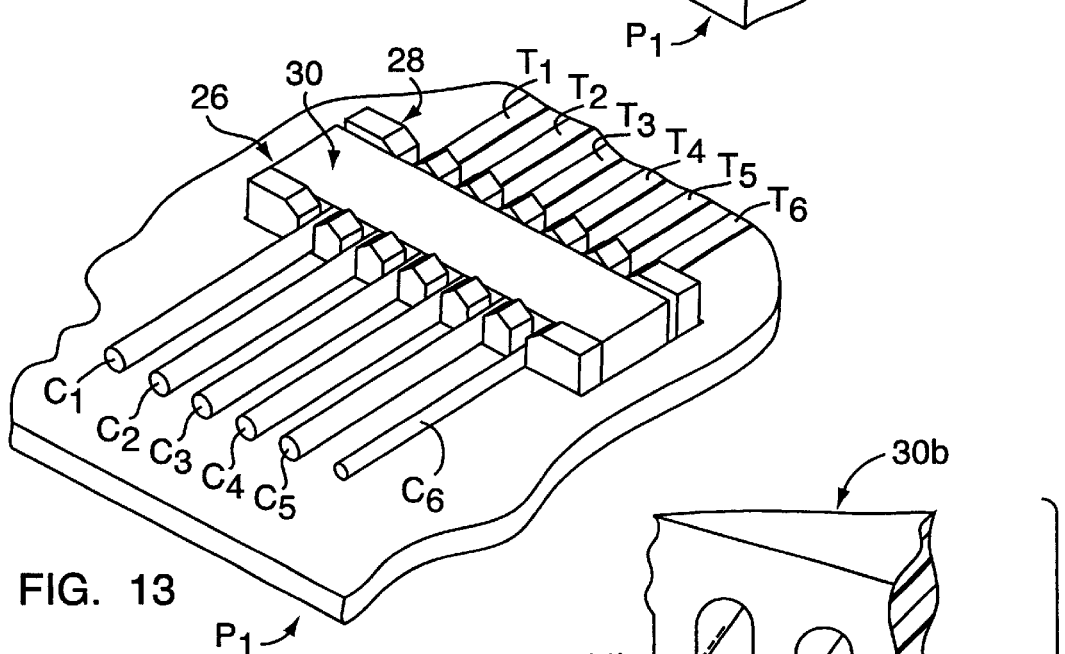
FIG. 13 is an exploded perspective view and shows another embodiment of the invention.

In FIGS. 12 and 13 there is shown another embodiment of the invention which has a panel $P_1$. Beams 20a, 20a which carry the terminal portions of circuit traces to be terminated are disposed inboard of the periphery of a panel $P_1$. The beams 20a, 20a are made by cutting or otherwise forming apertures or rectangular window openings W, W through the panel $P_1$ at opposite sides of and generally adjacent to a portion of each of the traces $T_1$–$T_6$ to be terminated. A cradle assembly 26 used in making the terminations is substantially identical to the cradle assembly 26 shown in FIGS. 1–3 and is assembled with the panel $P_1$ and in engagement with the beams 20a,20a in the manner hereinbefore described and may be employed to connect the illustrated traces $T_1$–$T_6$ to lead wires or terminals on one or more electrical components, such as electrical resistors (not shown), at positions on the panel $P_1$ and remote from the peripheral edge of the panel.

Figure 14:
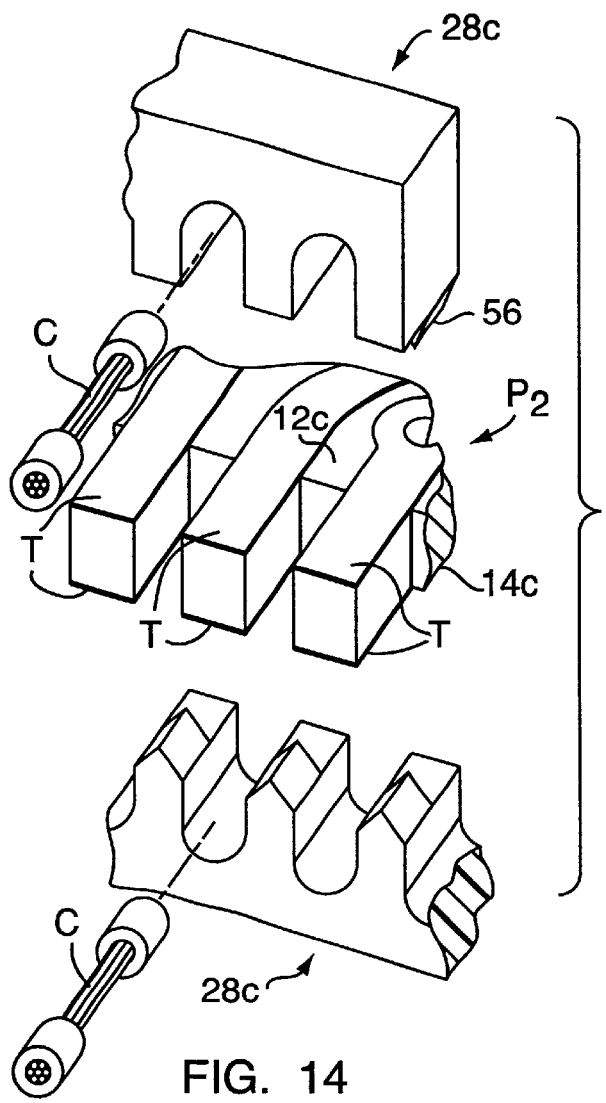
FIG. 14 is an exploded perspective view and illustrates yet another embodiment of the invention.

In FIG. 14 there is shown a further embodiment of the invention wherein a panel $P_3$ is shown which has upper and lower surfaces or substrates respectively indicated at 12c and 14c. Circuit traces T,T are disposed on and carried by both the upper and lower substrates 12c and 14c. Where substantially identical conductors C,C are employed to terminate substantially identical traces T,T on the upper and lower surfaces or substrates of a panel, such as the illustrated panel $P_2$ an hermaphroditic cradle assembly may be employed to form the termination barrels, that is a cradle assembly wherein an energy director cap members 28c and a substantially identical cradle member 28c form the cradle assembly, as shown in FIG. 14. Each member 28c carries energy directors 56,56 and has mating surfaces 58,58 which cooperates with the energy directors 56,56 on the opposite member 28c. The plane of joinder formed by the coengaging members 28c,28c which are ultrasonically welded together in assembly as hereinbefore described is disposed generally midway between the upper and lower surfaces of the panel $P_2$.

Figure 15:
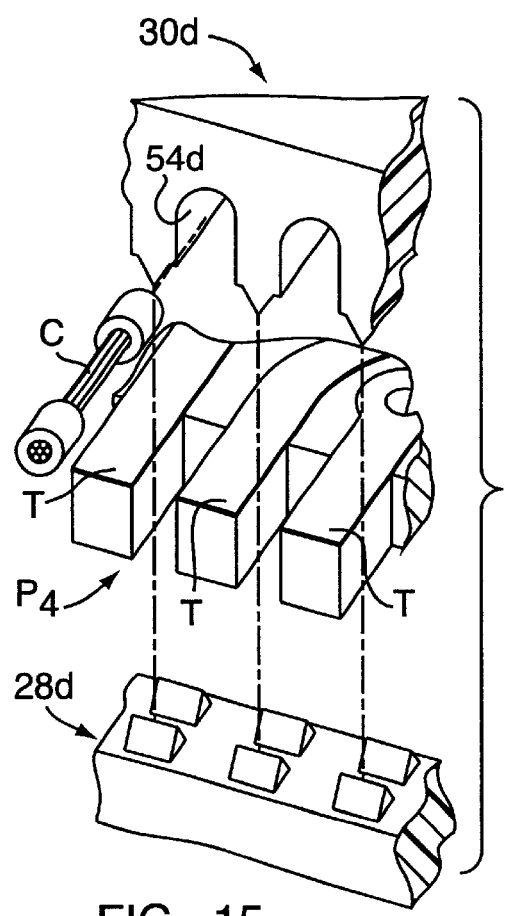
FIG. 15 is an exploded perspective view of a further embodiment of the invention.

In FIG. 15 there is shown still another embodiment of the invention where the panel, indicated generally at $P_4$, is a single sided relatively thin printed circuit board having an upper surface or substrate 12d which carries traces T, T. The cradle member indicated at 30d and which carries the primary energy directors defines each termination barrel 54d in its entirety. The cradle assembly which includes the cradle member 30d and the cap member 28d is formed by ultrasonically welding the cradle and cap members together in a plane of joinder which lies generally within the plane of the lower surface 14d of the panel $P_4$. The heat generated by the ultrasonic welding process is concentrated proximate the lower surface of the panel $P_4$ remote from the traces T, T on the upper surface of the panel.

In the embodiments of the invention hereinbefore described, the slotted openings in the circuit boards receive the connecting portions of the cradle assembly which join the cradle member and the cap member in assembly. Where cantilever beams are employed which have free ends terminating at a peripheral edge of a circuit board the beams may be readily formed by a gang sawing or milling operation.

Referring now to FIGS. 16–21, another embodiment of the invention is illustrated wherein beams for carrying circuit traces to be terminated may be readily defined inboard of the peripheral edge of a panel or circuit board by a simple drilling operation. This construction is advantageously employed in the production of a circuit board, in that circuit board manufacturing facilities often include provision for the gang drilling of holes through a board or panel to facilitate thru-plating where connected circuit traces are to be provided on both upper and lower surfaces of a board or circuit panel as hereinafter discussed.

Referring first particularly to FIGS. 16 through 19, a panel indicated at $P_5$ has upper and lower surfaces indicated at 12e and 14e. An in-line series of discrete circuit traces $T_1$–$T_4$ are carried by the upper surface or panel substrate 12e. Beams 20e which carry terminal portions of the circuit traces $T_1$–$T_4$ are preferably defined by a gang drilling operation whereby cylindrical apertures 18a,18a extending through the panel $P_5$ are formed at opposite sides of and generally adjacent each circuit trace. The terminal portion of each trace that is the portion carried by each beam 20e is indicated at 22e in FIG. 16.

In the illustrated embodiment 16, each of the traces $T_1$–$T_4$ is terminated by the associated electrical conductor $C_1$–$C_4$.

The cradle assembly for effecting the terminations include an elongated generally rectangular cradle member indicated generally at 30e and an elongated generally rectangular cap member indicated generally at 28e. The cradle member 30e defines a longitudinal series of downwardly open transversely extending conductor receiving cradles 46e, 46e dimensioned to receive the conductors $C_{1-C4}$ substantially as herein before discussed.

Figure 18:
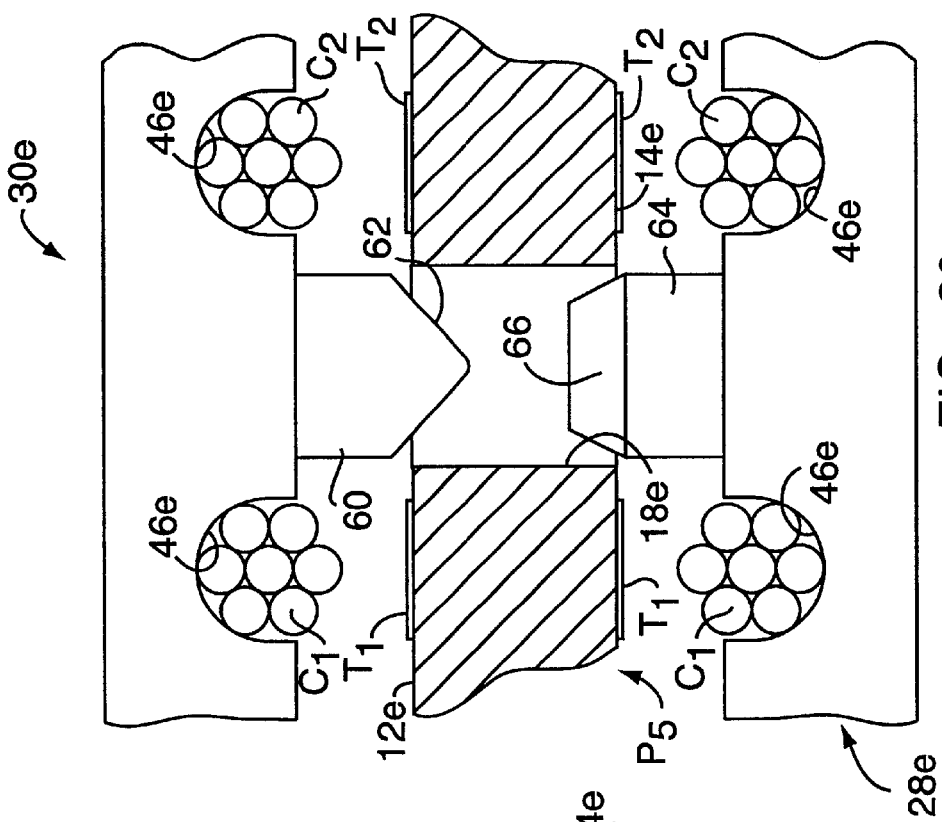
FIG. 18 is a somewhat enlarged fragmentary elevational view shown partially in section taken along the line 18—18 of FIG. 16 and in a condition of partial assembly.

The cradle assembly formed by the cradle member 30e and the cap member 28e are joined by integral connecting portions which extend through the apertures 18e,18e. The illustrated connecting portions include a series of first connecting members or cylindrical posts 60,60 integrally formed on and depending from the lower surface of the cradle member 30e and best shown in FIG. 17 wherein the cradle member 30e is shown in an inverted position. Each first connecting member 60 carries a primary energy director 62 which has a generally triangular cross section and an apex angle of approximately 90 degrees, as best shown in FIG. 18.

The cap member 28e includes a longitudinal series of upwardly projecting second connecting members or posts 64,64. Each post 64 includes an upwardly projecting secondary energy director 66 of generally triangular cross section which has an apex angle of approximately 60 degrees, as best shown in FIG. 18. The first and second posts 60 and 64 are sized to be received within an associated cylindrical aperture. 18e as shown in FIG. 18 where a typical termination is shown in a state of partial assembly.

The termination is completed by ultrasonically welding under pressure to cause melt-down of the primary and secondary energy directors within the cylindrical apertures 18e,18e to establish connected assembly between the cradle member and the cap member with resulting compression of the resilient electrical conductors, generally as afore described.

Figure 20:
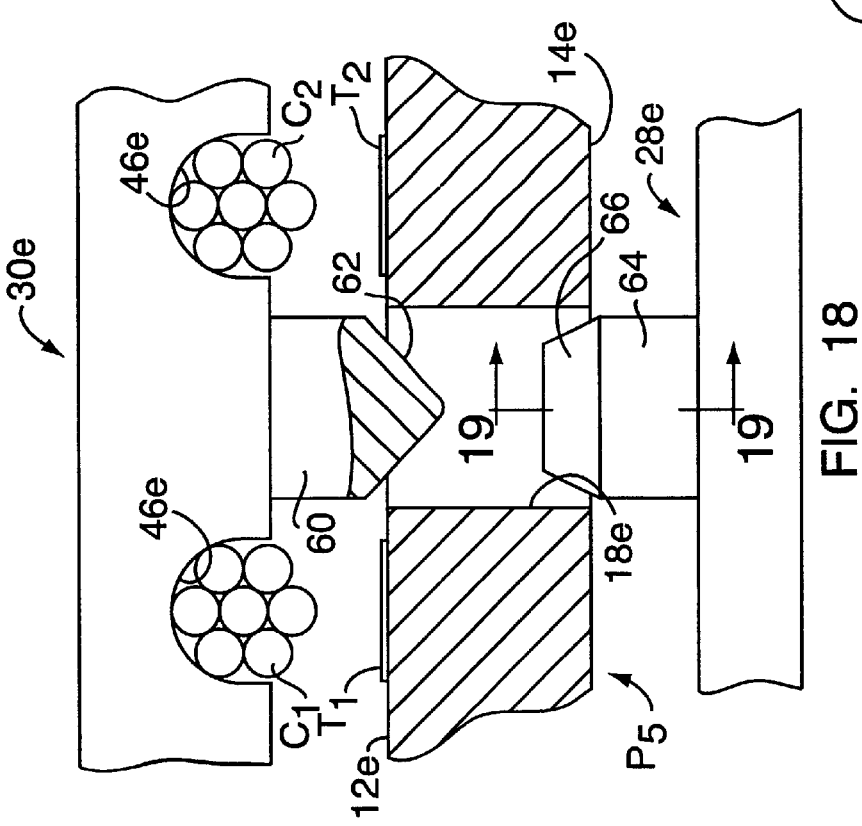
FIG. 20 is similar to FIG. 18 but illustrates in-line arrays of circuit trace terminations on upper and lower substrates of a circuit board.
Figure 19:
FIG. 19 is a fragmentary sectional view taken along the line 19—19 of FIG. 18.

In FIG. 20 there is shown a structure similar to the structure shown in FIG. 16. However, the panel $P_5$ has circuit traces on both its upper and lower substrates. The traces on the lower surface or substrate 14e are terminated by conductors $C_1$ and $C_2$ substantially identical to the conductors $C_1$ and $C_2$, which terminate the traces on the upper surface of the panel. However, the structure shown in FIG. 20 differs from the one in FIG. 16 in that the cap member 28e is provided with conductor receiving cradles 46e, 46e to accommodate the conductors for terminating the traces on the lower substrate 14e.

Figure 21:
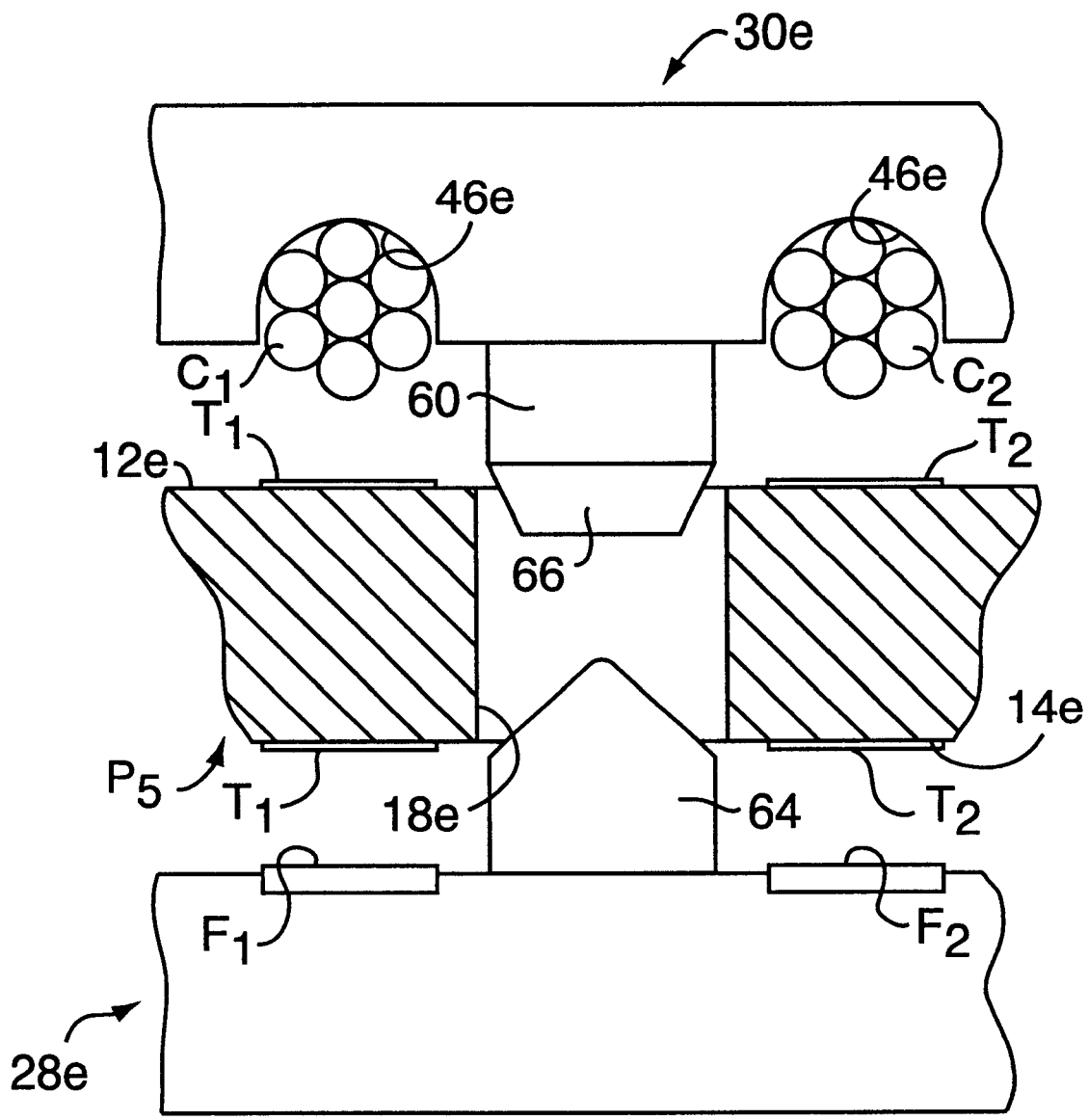
FIG. 21 is similar to FIG. 18 but illustrates yet another type of termination.

FIG. 21 illustrates a condition wherein traces on the upper and lower surfaces of the panel $P_5$ are terminated by conductors of different types. Specifically, the traces on the upper surface of the panel are terminated by stranded wire conductors whereas the traces on the lower surface or substrate 14e are terminated by substantially flat resilient compressible conductors $F_1$ and $F_2$. The compressibility factor of the flat conductors $F_1$ and $F_2$ is substantially negligible as compared to that of the stranded wire conductors $C_1$ and $C_2$. Where this situation exists it may only be necessary to consider the compressibility factor of the stranded conductors in determining the dimensioning of the conductor receiving slots.

Figure 22:
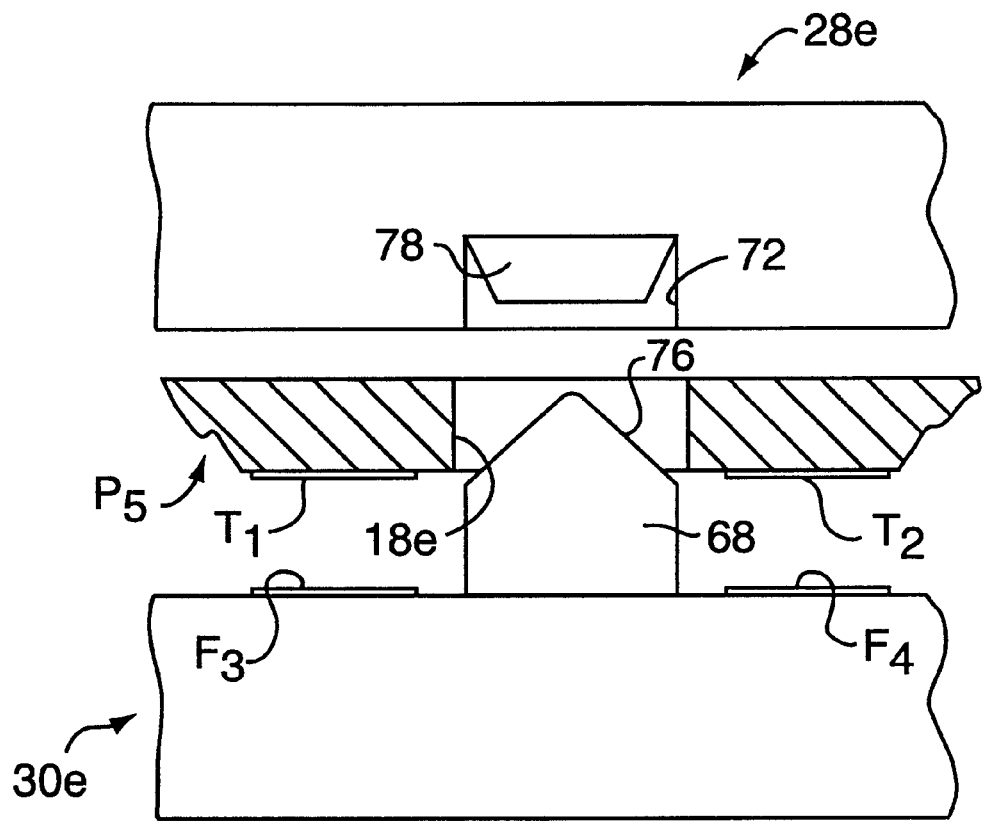
Figure 23:
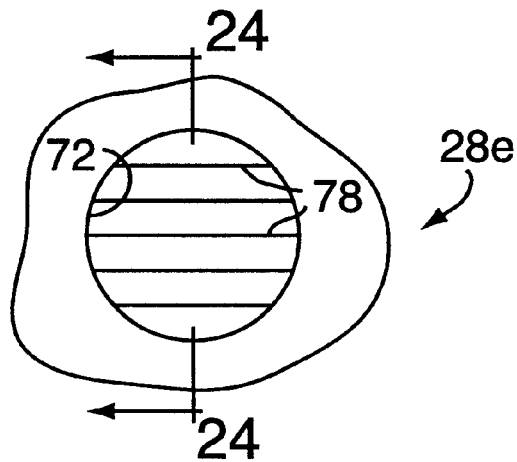
FIG. 23 is a fragmentary bottom-plan view of the cap member shown in FIG. 22.
Figure 24:
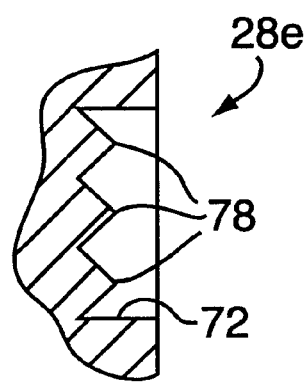
FIG. 24 is a sectional view taken along the line 24—24 of FIG. 23.

In FIG. 22 there is shown a circuit board termination wherein a circuit traces $T_1$ and $T_2$ on one surface relatively thin circuit board $P_6$ are terminated by a flat resilient compressible conductors $F_3$ and $F_4$. In this instance, connecting members or posts 68, 69 (one shown) are preferably integrally formed on a cradle member 70 and generally cylindrical post-receiving recesses 72, 72 are formed in a cap member 74 to receive the posts. Primary energy directors 76, 76 are carried by the posts 68, 68 whereas one or more the secondary energy directors 78 are disposed within each post receiving recess 72.

I claim:

1. A printed circuit termination comprising; a panel, at least a portion of the panel being substantially rigid and having parallel upper and lower surfaces, at least one of said surfaces defining a substrate, said portion of the panel having spaced apart openings therethrough defining a beam therebetween, a circuit trace carried by said substrate and having a terminal portion extending along said beam, a resilient compressible electrical conductor disposed in overlying electrical contacting engagement with said terminal portion, and a cradle assembly made from ultrasonically weldable material and including a cradle and a cap welded together in assembly and cooperating in assembly to define a termination barrel including connecting portions extending through said openings, said termination barrel receiving and confining therein at least portions of said beam, said terminal portion and said resilient compressible electrical conductor and maintaining under compression that portion of said resilient compressible electrical conductor disposed within said termination barrel whereby said electrical conductor is continuously resiliently biased into electrical contacting engagement with said terminal portion of said circuit trace.

2. A printed circuit termination as set forth in claim 1 wherein said openings comprise generally parallel slots.

3. A printed circuit termination as set forth in claim 1 wherein said openings are spaced inwardly from a peripheral portion of said panel.

4. A printed circuit termination as set forth in claim 1 wherein said cradle and said cap are substantially identical to each other.

5. A printed circuit termination as set forth in claim 1 wherein said connecting portions comprise posts.

6. A printed circuit termination as set forth in claim 1 wherein the other of said surfaces defines another substrate which carries another trace having another terminal portion extending along said beam and said printed circuit termination includes another electrical conductor disposed in overlying electrical contracting engagement with said another terminal portion and said another electrical conductor.

7. A printed circuit termination as set forth in claim 2 wherein said slots open outwardly through a peripheral edge of said panel.

8. A printed circuit termination as set forth in claim 3 wherein said openings comprise generally parallel slots.

9. A printed circuit termination as set forth in claim 3 wherein said openings comprise axially parallel generally cylindrical holes through said panel.

10. A printed circuit termination as set forth in claim 4 wherein said connecting portions comprise a plurality of posts.

11. A printed circuit termination as set forth in claim 10 wherein said posts are connected to said cradle and said cap and ultrasonically welded to each other within said openings.

12. A printed circuit termination as set forth in claim 10 wherein each of said posts is carried by one of either said cradle or said cap and ultrasonically welded to the other either said cradle or said cap.

13. A printed circuit termination as set forth in claim 10 wherein each of said posts is carried by one of either said cradle or said cap and ultrasonically welded to the other either said cradle or said cap within a recess defined by said other of either cradle or said cap.

14. A method for making a printed circuit termination; comprising the steps of applying an electrically conductive circuit trace to at least one surface of a circuit board having parallel upper and lower surfaces, cutting openings through the circuit board at opposite sides of the trace to define a beam on the circuit board carrying a terminal portion of the trace, forming an ultrasonically weldable cradle assembly including a cradle member and a cap member for assembly to define a termination barrel, positioning a portion of a resilient compressible electrical conductor in overlying electrical contacting engagement with the terminal portion of the trace, preassembling the cradle assembly through the opening in the circuit board with one of the members at the upper side of the circuit board and the other of the members at the lower side of the circuit board and with the terminal portion of the trace and the overlying portion of the compressible electrical conductor within the termination barrel formed by the assembly, applying force to the cradle member and the cap member to urge the cradle and cap members toward assembly with each other, and ultrasonically welding the cradle and cap numbers in assembly while the force is being applied to define a termination barrel containing at least portions of the beam, the terminal portion of the trace and the electrical conductor, whereby said cradle assembly maintains under compression the portion of the conductor within the termination barrel.

15. A method for making a printed circuit termination as set forth in claim 14 wherein said step of cutting openings is further characterized as cutting slots opening through the circuit board substantially adjacent the trace.

16. A method for making a printed circuit termination as set forth in claim 14 wherein the step of forming is further characterized as forming posts on at least one of the members, the step of preassembling is further characterized as preassembling the members with the posts within the openings in the circuit board, and the steps of ultrasonically welding is further characterized as ultrasonically welding the posts on the one of the members to the other of the members.

17. A method for making a circuit trace termination as set forth in claim 14 wherein the step of applying force is further characterized as applying a predetermined pressure to the cradle and cap member to attain a predetermined percentage change in the dimension of compressible electrical conductor in the direction of the applied pressure.

18. A method for making a printed circuit termination as set forth in claim 15 wherein the step of cutting slots is further characterized as cutting slots opening through a peripheral edge of the circuit board.

19. A method for making a printed circuit termination as set forth in claim 15 wherein the step of cutting slots is further characterized as cutting slots through the circuit board in inwardly spaced relation to a peripheral portion of the circuit board.

20. A method for making a printed circuit termination as set forth in claim 15 wherein the step of cutting is further characterized as drilling holes through the circuit board substantially adjacent opposite sides of the trace.

* * * * *